United States Patent [19]
Mizuno et al.

[11] Patent Number: 5,888,900
[45] Date of Patent: Mar. 30, 1999

[54] METHOD FOR MANUFACTURING SEMICONDUCTOR DEVICE AND RETICLE FOR WIRING

[75] Inventors: Makoto Mizuno; Toshihiro Shimizu; Masaaki Fujishima, all of Utsunomiya; Koji Hanihara, Isawa-cho; Itaru Tsuchiya, Shikishima-cho; Yasuo Yagi, Kawasaki, all of Japan

[73] Assignees: Kawasaki Steel Corporation, Kobe; Pioneer Electronic Corporation, Tokyo; Pioneer Video Corporation, Yamanashi, all of Japan

[21] Appl. No.: 901,697

[22] Filed: Jul. 28, 1997

[30] Foreign Application Priority Data

Jul. 30, 1996 [JP] Japan .................................. 8-199987
Oct. 1, 1996 [JP] Japan .................................. 8-260431

[51] Int. Cl.⁶ ........................................... H01L 21/4763
[52] U.S. Cl. ........................ 438/631; 438/633; 438/666; 438/668; 438/926
[58] Field of Search ............................ 438/631, 633, 438/666, 668, 926

[56] References Cited

U.S. PATENT DOCUMENTS

| 5,293,503 | 3/1994 | Nishigoori | 174/250 |
| 5,459,093 | 10/1995 | Kuroda et al. | 437/51 |
| 5,488,007 | 1/1996 | Kim et al. | 437/47 |
| 5,556,805 | 9/1996 | Tanizawa et al. | 437/195 |
| 5,652,465 | 7/1997 | Hosoda et al. | 257/758 |

Primary Examiner—John F. Niebling
Assistant Examiner—David A Zarneke
Attorney, Agent, or Firm—Oliff & Berridge, PLC

[57] ABSTRACT

A method for manufacturing semiconductor device is provided, this method comprises the steps of: depositing a metal film for forming wirings on a substrate; forming a wiring layer, wherein dummy wiring is inserted between wiring space where the dummy wiring can be inserted, and wiring space, where the dummy wiring cannot be inserted, is reduced by widening wiring pattern facing the wiring space; forming an interlayer insulating film on said wiring layer; and flattening surface of the interlayer insulating film. The film can be flattened by a CMP method or by an etchback of entire surface of the film. It is possible to flatten the surface of the semiconductor device cost-effectively and precisely.

17 Claims, 18 Drawing Sheets

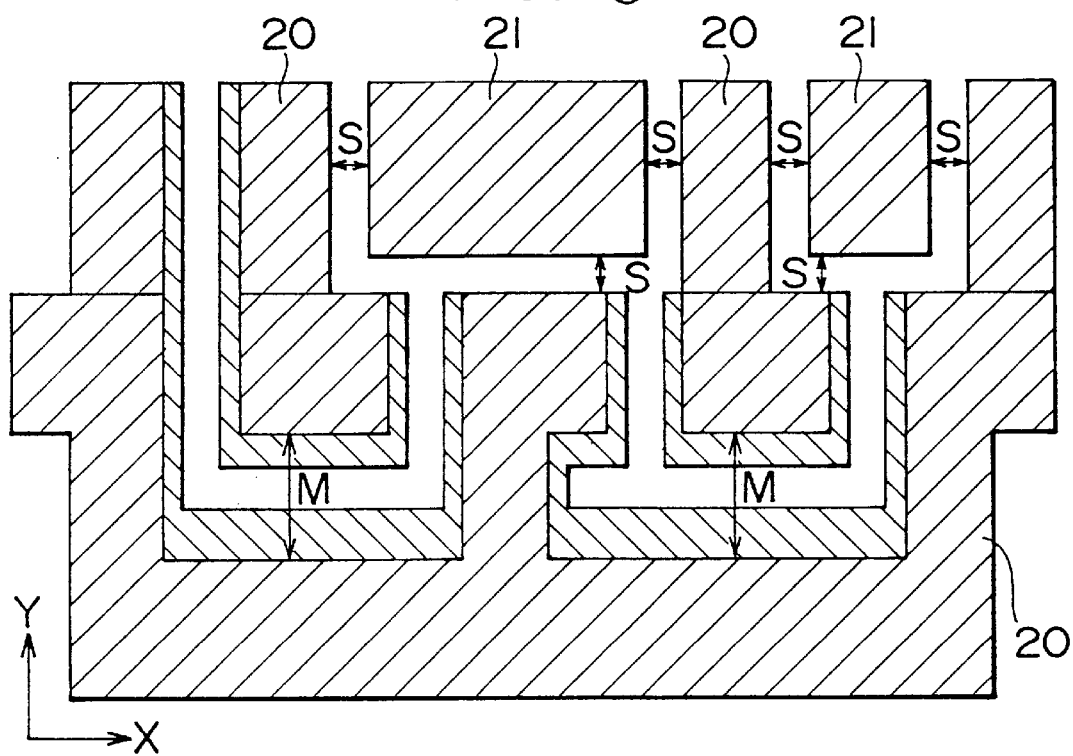

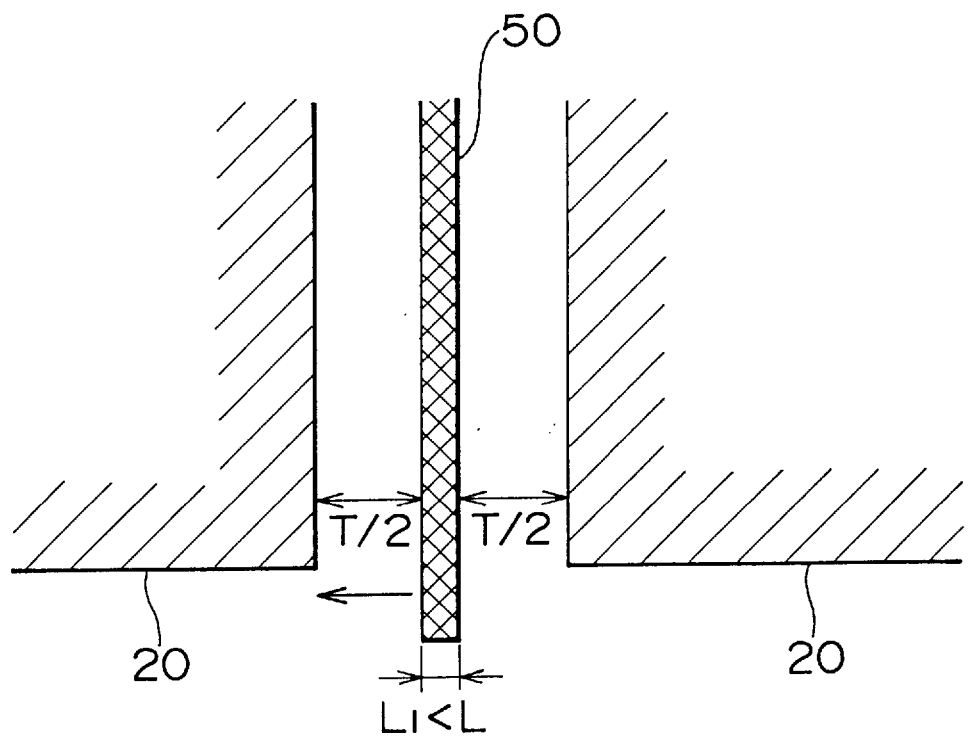
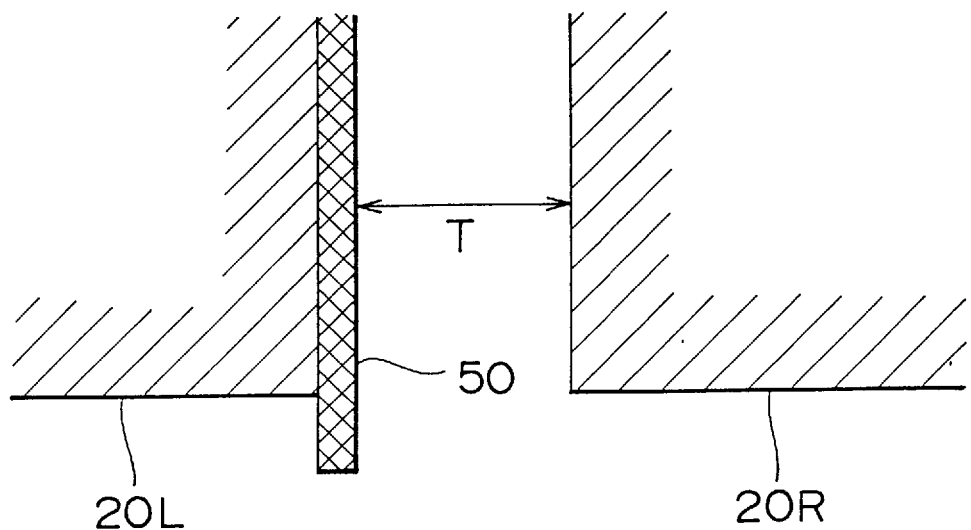

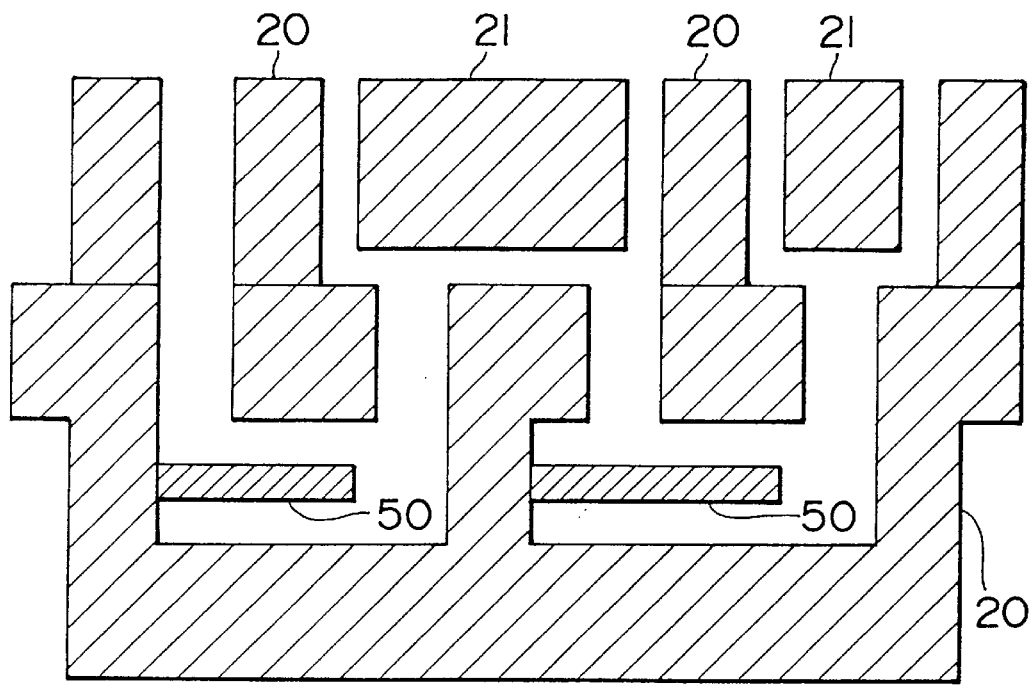
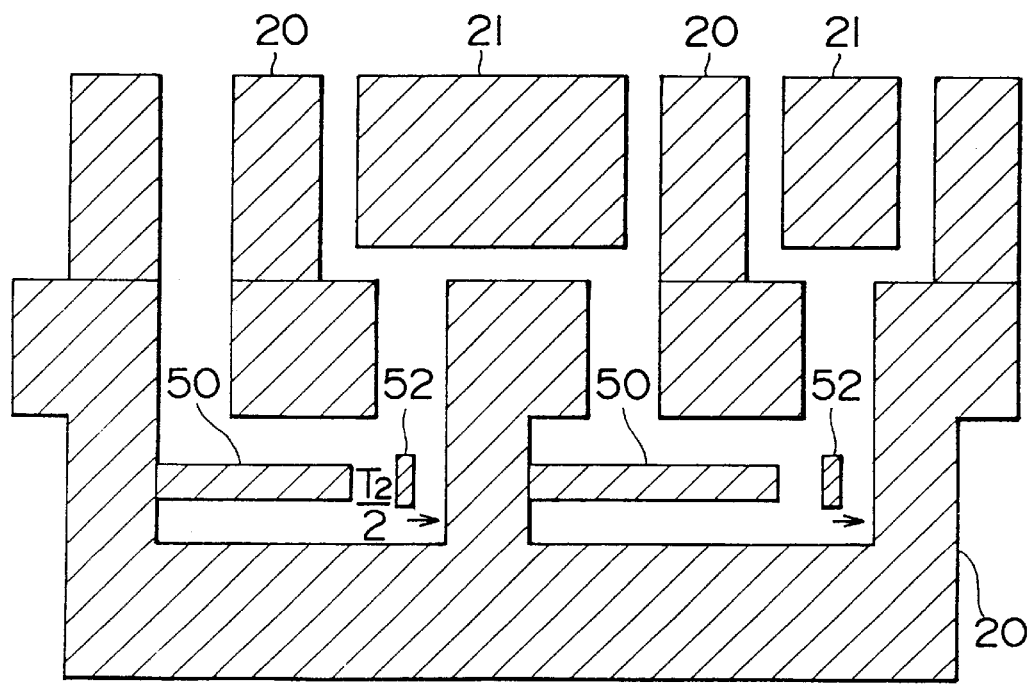

METHOD FOR MANUFACTURING SEMICONDUCTOR DEVICE AND RETICLE FOR WIRING

BACKGROUND OF THE INVENTION

1. Field of the Invention

The present invention relates to a method for manufacturing semiconductor device and reticle for wiring. Particularly, the present invention relates to a method suited for manufacturing a semiconductor device having multiple wiring structure and capable of flattening the surface of the device.

2. Description of the Related Art

According to the conventional semiconductor device as shown in FIG. 24 where a MOS transistor is illustrated, a plurality of diffused layer regions 12 serving as a source and a drain are provided on a semiconductor substrate 10 and a first metal wiring layer 20 made of such as aluminum is provided to connect the elements through a contact hole 17 between respective diffused layer regions 12. The configuration of metal wiring layers varies with element arrangement. In FIG. 24, a lower wiring layer 18 by a polysilicon gate and the like is provided.

In such a case, as is well known, the flatness of the interlayer films with respect to the lower wiring layer depends on the wiring width or wiring space, especially the latter, of the lower wiring layer 18 and the like. Therefore, if various wiring spaces exist in the semiconductor chip, conditions or method of forming interlayer films disadvantageously becomes complex.

To solve this, as shown in FIG. 25, electrically independent dummy wirings 21 are provided in a wide wiring space. By forming the dummy wiring 21, wiring space can be narrowed and conditions and method of forming interlayer films can be thereby made simpler than in the case where no dummy wiring is provided.

However, the conventional method of forming normal wiring 20 and independent dummy wiring 21 has a problem that the dummy wiring 21 cannot be inserted if the space between the normal wirings 20 is not wider than the allowable minimum space between wirings for providing the dummy wiring of minimum width.

In other words, as shown in FIG. 26, if the space between normal wiring 20 is greater than 2S+L (where S is a minimum wiring space allowed by the wiring rule and L is a minimum wiring width allowed by the wiring rule), it is possible to insert a dummy wiring 21 having a width of L+α a greater than L as shown in FIG. 27. On the other hand, if the space between the wiring 20 is smaller than 2S+L, the width of the dummy wiring 21 is L–α smaller than a minimum wiring width L as shown in FIG. 27. This is out of the design rule and eventually the dummy wiring 21 is eliminated and cannot be left.

As mentioned above, the flatness of an interlayer film between wiring layers depend on a wiring space. As shown in FIG. 28, for example, a coating film 34 by a normal SOG (Spin On Glass) is put between CVD (Chemical Vapor Deposition) oxide films 36 as an interlayer film between the lower wiring layer 18 and a layer of the wiring 20. In such a case, there exists an optimum wiring space for flattening the interlayer film by burying the coating film 34 into a recessed part. However, there is a problem that if a wiring space into which a dummy wiring cannot be inserted, the interlayer film cannot be sufficiently flattened.

Furthermore, as the high integration of an LSI (Large Scale Integrated circuit) progresses, wiring become narrower and multiple wiring layers are increasingly formed. To realize narrow wiring and multiple wiring layers, it is necessary to maintain an enough focus depth when a resist pattern is exposed to light during the step of patterning wiring by reticle. As a result, it becomes increasingly important to sufficiently flatten layers.

As a method of realizing flat layers, a so-called CMP (Chemical Mechanical Polishing) method is widely known. The CMP method is for polishing and flattening uneven portions of an oxide film formed on a wiring.

The CMP method will now be described in more detail with reference to FIGS. 29 and 30. An interlayer insulating film 16 and a metal wiring 20 are formed on a semiconductor substrate 10 such as a silicon substrate by a normal method in advance. As shown in FIG. 29, after the formation of the metal wiring 20, an insulating film 22 for isolating an upper wiring layer (not shown) formed above the metal wiring 20 is formed. Then the surface of the insulating film 22 is chemically and mechanically polished by the CMP method to thereby form a flat interlayer film shown in FIG. 30.

During the CMP method, if forming the insulating film 22, the lowest surface portion 221 of the insulating film 22 needs to be positioned relatively higher than the surface position 20u of the metal wiring 20 by approximately a film thickness necessary for insulation of the upper wiring layer (not shown). To do so, there are proposed three methods for the formation of an insulating film as follows.

A: The film is formed by using a high density plasma CVD method excellent in burying the insulating film between wirings.

B: Space between the wirings is buried by SOG.

C: The film is heavily piled by the normal CVD method until wiring layers are buried.

However, the high density plasma CVD method used in the method A is a latest state of the art at present and therefore requires a novel device. Furthermore, in the method B, buried material formed by SOG method has low film quality and low insulation. Therefore, it is necessary to provide a sandwich structure that the buried material is put between highly insulating materials. As a result, three more manufacturing steps are needed.

For these reasons, in many cases, the method C is adopted. However, in this method C, too, if a film forming method with bad coverage which cannot cover the unevenness of the substrate is used, an overhang is formed above a portion between the wirings and a void 38 is generated below the overhang as shown in FIG. 31. Due to this, if a film is polished to a thickness shown in a broken line A by the CMP method, a recessed part 22r is formed in the flat surface.

To prevent this, good coverage, like a film forming method with a TEOS base P-CVD method, for example, is needed. However, the ratio (film formation ratio) of the thickness B of the insulating film 22 deposited on the wiring 20 to the thickness C of the insulating film 22 deposited between wirings is about 5:3 as shown in FIG. 32. Therefore, if a wiring space of as wide as approximately 2 to 5 μm exists, a difference in wiring thickness is 5000 Å and it is necessary to leave an insulating film of a thickness of 5000 Å on the wiring after the CMP method, the insulating film on the wiring is required to be as thick as approximately

17000 Å=(5000 Å+5000 Å)×5÷3 and to be polished by approximately

12000 Å=17000 Å–5000 Å by the CMP method. This adversely affects device throughput and manufacturing costs in large degree.

To prevent the above, a dummy pattern is provided between the metal wirings 20 to narrow the wiring space and a film from a wiring sidewall 20s is grown to bury space between the wiring to thereby make the necessary insulating film thinner before the CMP method is conducted. In this case, too, as shown in FIG. 32, the film formation ratio B:D at the wiring sidewall 20s is as low as approximately 5:2. Therefore, as shown in FIG. 33, a slight increase in the wiring space which occurs when, for example, parallel wirings 20 are bent, causes the insulating film prior to conducting the CMP method to be thicker. This results in lowering in throughput and an increase in manufacturing costs. In FIG. 33, the wiring space between straight wirings is 1.2 μm whereas that between bent wirings is widened to 1.2√2 μm.

Take the case of forming a flat insulating film having a minimum thickness of 7000 Å on the upper wiring layer having a thickness of 6000 Å by using the wiring pattern of FIG. 33, for example. An interlayer insulating film 16 and a metal wiring 20 of a thickness of 6000 Å formed on the interlayer insulating film 16 are formed on a silicon substrate (not shown) in advance using the pattern of FIG. 33 and by the ordinary method. In this case, the cross-sectional view showing the widest wiring space in the pattern taken along a line E—E of FIG. 33 is illustrated by FIG. 34. In this state, using the P-TEOS CVD device for forming an insulating film having good coverage, an insulating film 22 for isolating the wiring from an upper wiring is formed. In the P-TEOS CVD device, the film formation ratio of the upper portion of the wiring and the sidewall is 5:2. To bury the space 1.2√2 μm between wirings shown in FIG. 34, an insulating film needs to have a thickness of approximately 21000 Å as shown in FIG. 35. Since the maximum film thickness which can be formed by the P-TEOS CVD method per one step is 9000 Å, steps of forming a film of a thickness of 7000 Å are conducted three times. The configuration after the film formation is completed is illustrated by FIG. 35. In this state, the film is polished by 14000 Å by the CMP method to thereby provide a desired flat insulating film illustrated by FIG. 36.

As can be seen from the above description, in the wiring pattern of FIG. 33, a flat insulating film of FIG. 36 cannot be obtained without forming an insulating film 16 to a thickness of not less than 21000 Å by the three steps and thereafter polishing the film 16 by 14000 Å by the CMP method.

SUMMARY OF THE INVENTION

The present invention has been made to solve the above problems of prior art. It is a first object of the present invention to flatten an upper surface of the semiconductor device.

It is a second object of the present invention to reduce the wiring space of not less than S and less than L+2S into which a dummy wiring cannot be inserted according to the conventional method to thereby facilitate flattening interlayer films.

It is a third object of the present invention to form an insulating film, which should be flattened later, by minimum required thickness.

The first invention according to the present application attains the first and the second objects of the present invention by a method for manufacturing semiconductor device, comprising the steps of: depositing a metal film for forming wirings on a substrate; forming a wiring layer, wherein dummy wiring is inserted between wiring space where the dummy wiring can be inserted, and wiring space, where the dummy wiring cannot be inserted, is reduced by widening wiring pattern facing the wiring space; forming an interlayer insulating film on said wiring layer; and flattening surface of the interlayer insulating film.

The both wiring patterns facing the wiring space may be widened by almost the same value.

Further, the wiring space, wherein the dummy wiring cannot be inserted, may be reduced to the minimum wiring space, or to twice as large as the minimum wiring space.

Futhermore, the step of flattening the surface of the interlayer insulating film may be conducted by a Chemical Mechanical Polishing method, or by an etchback of entire surface of the interlayer insulation film.

Further, a wiring space at a bent portion may be made smaller than a wiring space at a simply bent portion in the step of forming the wiring layer.

The wiring space at the bent wiring portion may be narrowed by adding an isosceles triangle-shaped portion to a corner of an outer wiring.

Further, a corner of an inner wiring may be cut.

According to the present first invention, even if the wiring space is too small for a dummy wiring to be inserted, the wiring widths on both sides can be expanded and the wiring space can be reduced by using a simple method of an automatic operation on the CAD. Therefore, the coverage on the upper wiring can be improved and wiring defects can be reduced, whereby highly reliable wiring can be formed by the simplified manufacturing method.

In addition, even if there is a problem of the wiring coupling capacity, an optimum capacity can be obtained by selecting a maximum final wiring space appropriately.

The second invention according to the present application attains the above-described first and second objects by a method for manufacturing semiconductor device having multiple wirings or reticle for wiring, comprising the steps of: generating an imaginary wiring pattern having a predetermined width in a portion having too narrow a space between wirings to insert a dummy wiring thereinto; attaching the generated imaginary wiring pattern to at least one of wiring patterns facing the wiring space; and eliminating a portion having a width narrower than a minimum wiring width from the wiring pattern after attaching the imaginary wiring pattern, thereby widening said wiring pattern facing the wiring space.

The predetermined width may be set at a predetermined value not more than a maximum wiring width, and while the predetermined value being reduced, the predetermined value may be added to both of wiring patterns facing the wiring space by repeating the addition operation until a target wiring space is obtained.

Further, the predetermined width made be set at approximately half a width necessary to expand a wiring for obtaining a target wiring space, and the predetermined width may be added to both of wiring patterns facing the wiring space by twice operation.

The above processing may be conducted in two directions perpendicular to each other.

According to the present second invention, the thickness of the insulating film prior to polishing can be reduced to the minimum for obtaining a desired flat insulating film. Due to this, the through put of the film formation device and the polishing device can be improved and the manufacturing cost can be reduced. In addition, if the film is flattened by the CMP method, the polishing amount can be lessened to thereby improve flatness more precisely.

According to the present invention, it is possible to flatten the surface of the semiconductor device.

These and other novel features and advantages of the present invention will become apparent from the following detailed description of preferred embodiments.

BRIEF DESCRIPTION OF THE DRAWINGS

The preferred embodiments will be described with reference to the drawings, wherein like elements have been denoted throughout the figures with like reference numerals, and wherein:

FIG. 3 illustrates an embodiment wherein wiring space of FIG. 2 is narrowed to the minimum wiring space according to the first invention;

FIG. 4 is a top face view showing that a first imaginary wiring pattern has been generated between normal wiring in the first embodiment;

FIG. 5 is a top face view showing that the first imaginary wiring pattern has been attached to the left-side normal wiring in the first embodiment;

FIG. 10 is a top face view showing that the first imaginary wiring pattern of FIG. 9 has been attached to the left-side circuit pattern;

FIG. 11 is a top face view showing that the second imaginary wiring pattern has been generated in the X direction in the circuit pattern of FIG. 10;

DETAILED DESCRIPTION OF THE PREFERRED EMBODIMENTS

The embodiments of the present invention will hereunder be described in detail with reference to the accompanying drawings.

The present first invention will be described with reference to the first embodiment.

Figure 1:
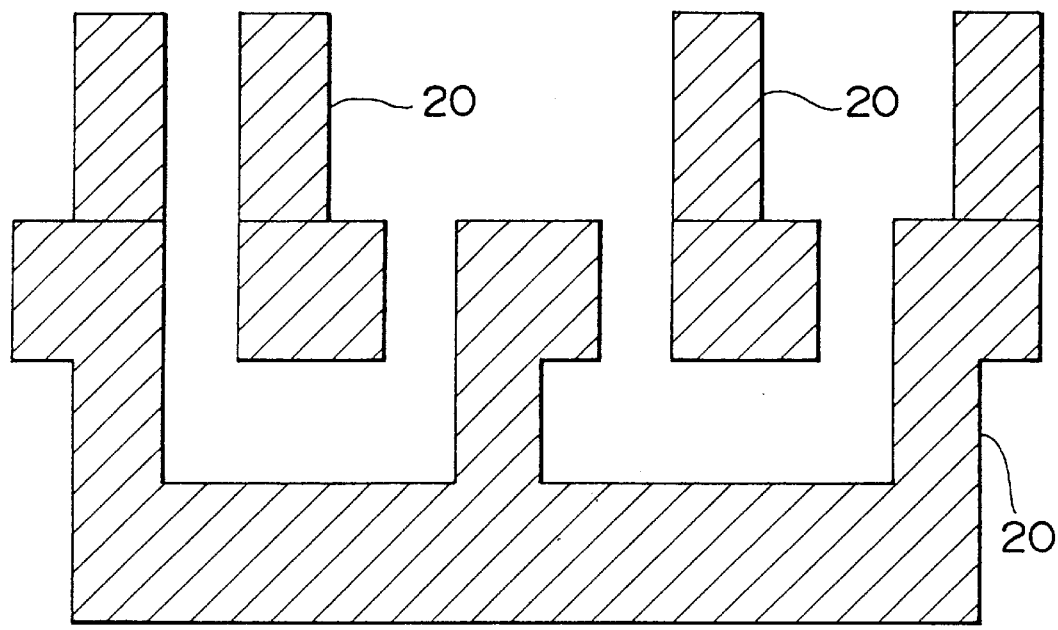
FIG. 1 illustrates the first embodiment according to the present first invention and is a top face view showing a normal circuit pattern before dummy wiring are inserted.
Figure 2:
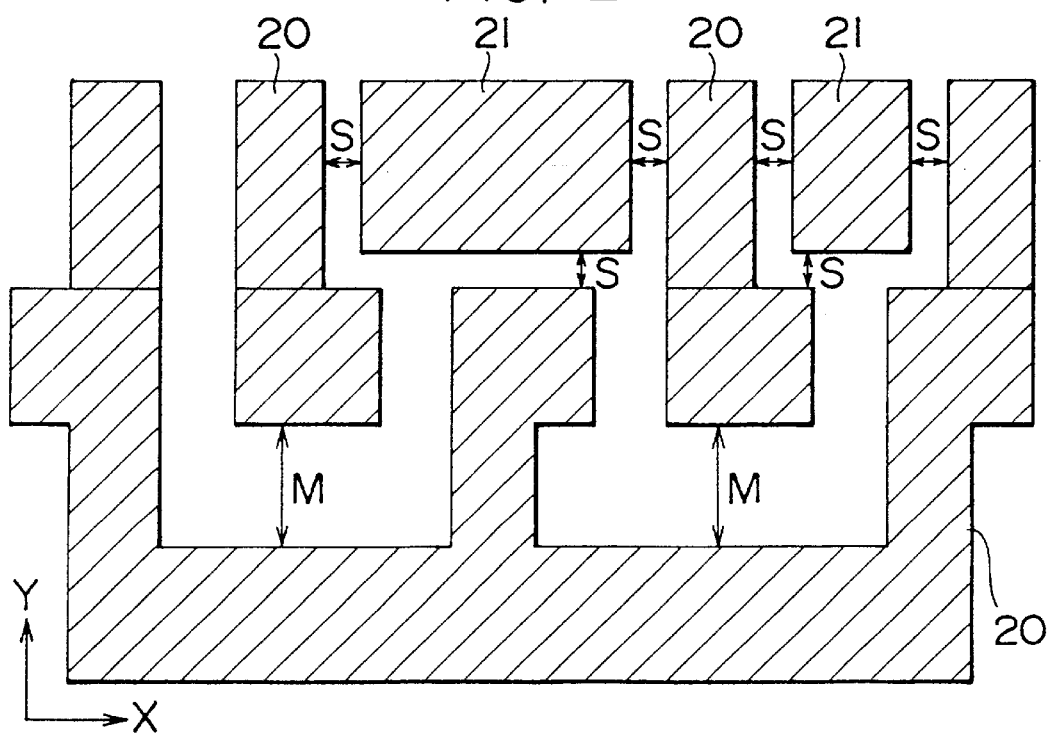
FIG. 2 is a top face view showing that dummy wiring are inserted into the circuit pattern of FIG. 1.

FIG. 2 shows that dummy wirings 21 are provided between the normal wiring 20 as shown in FIG. 1. To form the dummy wirings 21, a reverse pattern of the normal wiring 20 (non-wiring part pattern) shown in FIG. 1 is formed, reduced in size (or undersized) by $S+(L/2)=1.0+(1.4/2)=1.7$ μm and expanded in size (or oversized) by $L/2=1.4/2=0.7$ μm.

Thus, the dummy wirings 21 distanced from the normal wiring 20 by a minimum wiring space S can be generated.

It is noted that the reason the reverse pattern in the wiring region is undersized not by S but by S+(L/2) and oversized by L/2 is to prevent portions against wiring rule of the minimum wiring with L from occurring if it is undersized simply by S.

More specifically, when the minimum wiring space is, for example, 3.0 μm, the reverse pattern of a width of 3 μm is reduced by undersize of S to 3.0−(2×1.0)=1.0 μm which is against the minimum wiring width (1.4 μm) rule. In contrast thereto, by undersize of S+(L/2), the reverse pattern is reduced to 3.0−(2×1.7)=−0.4 μm.

As a result, the pattern can be eliminated in the normal CAD design and is not against the rule.

By generating dummy wiring 21 and composing them with the normal wiring 20, a wiring pattern after the dummy wiring are inserted, as shown in FIG. 2, is obtained. The wiring space M after the dummy wiring have been inserted is $$2 \times [S + (L/2)] = 2 \times [1.0 + (1.4/2)] = \text{less than } 3.4 \text{ μm.}$$

The pattern shown in FIG. 2 can be obtained by the conventional technique. The method of inserting dummy wiring should not be, however, limited to the above-described method.

FIG. 3 shows an example wherein wiring space of FIG. 2, to which dummy patterns are inserted, is reduced to the minimum wiring space by the first invention.

In this example, wiring space of more than minimum distance S=1.0 μm and less than 2S+L=3.4 μm, to which dummy pattern cannot be inserted, is reduced by widening wiring pattern facing the wiring space.

More specifically, wiring patterns facing the wiring space are both widened by almost same value.

It is desirable that the wiring space is reduced to the minimum wiring space.

Next, the second embodiment of the first invention realized by CAD will be described.

In this embodiment, as shown in FIG. 4, a first imaginary wiring pattern 50 having a predetermined width L1 which is narrower than a minimum wiring width L is generated in the center of the portion which is too narrow to allow a dummy wiring to be inserted thereinto so that the length between the pattern 50 and the normal wiring 20 is, for example, T/2. Then, as shown in FIG. 5, the generated imaginary wiring pattern 50 is attached to one of the adjacent normal wiring 20 (the left side normal wiring 20L in FIG. 4).

Figure 6:
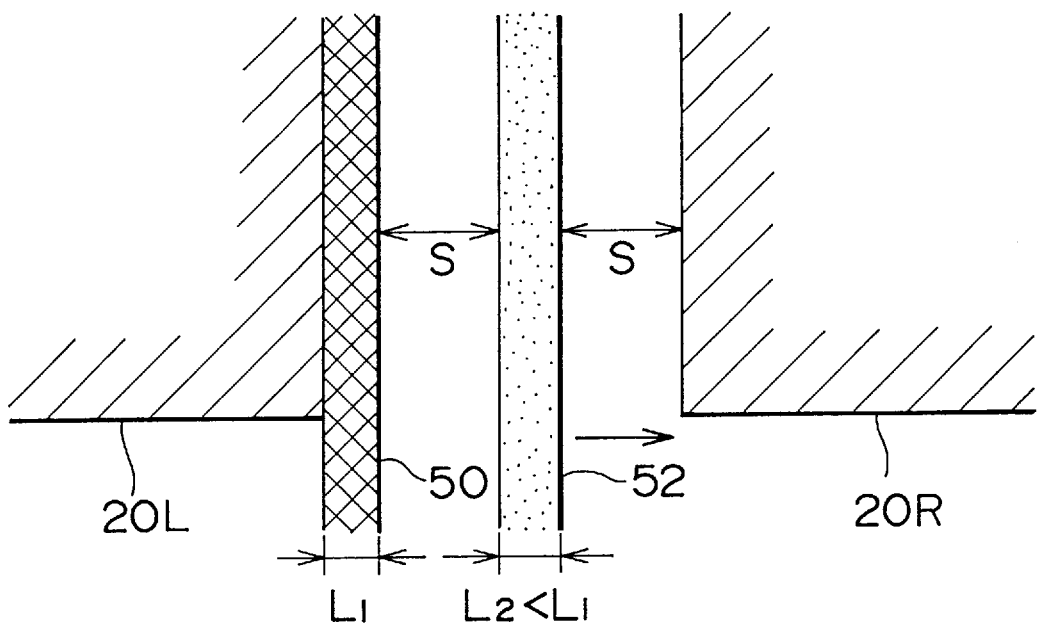
FIG. 6 is a top face view showing that a second imaginary wiring pattern has been generated in the first embodiment.
Figure 7:
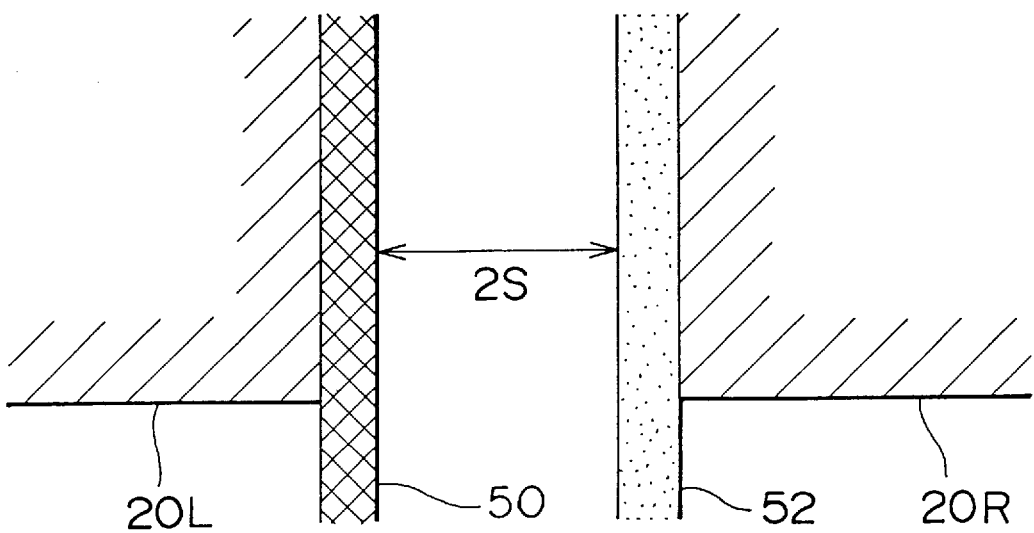
FIG. 7 is a top face view showing that the second imaginary wiring pattern has been attached to the right-side normal wiring in the first embodiment.

As shown in FIG. 6, a second imaginary wiring pattern 52 having a predetermined width L2 which is narrower than the width of the first imaginary wiring pattern 50 is generated, for example, in the center of the remaining wiring space T so that the resultant wiring space is S. As shown in FIG. 7, the second imaginary wiring pattern 52 is attached to the other of the adjacent normal wiring 20 (the right side normal wiring 20R in FIG. 6) which is opposite to the wiring to which the first imaginary wiring pattern 50 is attached. As a result, the space between the left-side normal wiring 20L, to which the first imaginary wiring pattern 50 is attached, and the right-side normal wiring 20R, to which the second imaginary wiring pattern 52 is attached, can be narrowed to 2S.

Figure 8:
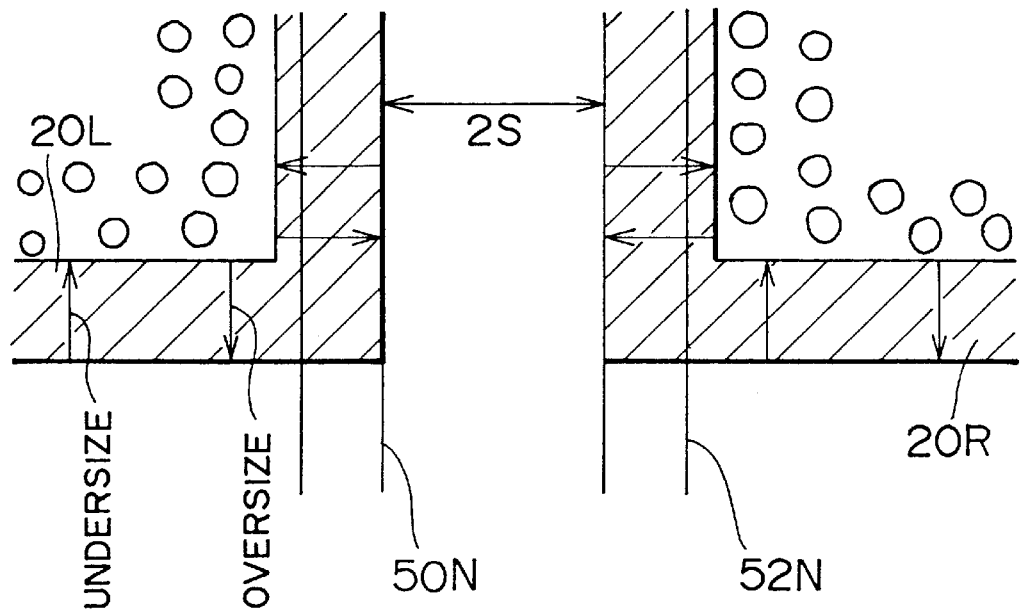
FIG. 8 is a top face view showing notches have been eliminated from the circuit pattern of FIG. 7.

Next, as shown in FIG. 8, among the first and second imaginary wiring patterns 50 and 52, notch portions 50N and 52N having a width narrower than the minimum wiring width are eliminated by, for example, reducing in size (undersized) and then extending (oversized) in accordance with the normal CAD design rule, thereby desired wiring patterns are obtained.

By conducting these procedures at a design stage, the minimum wiring space can be reduced to 2S and interlayer films using a structure that a normal coating film is put between CVD oxide films can be flattened more easily.

Typically, the following procedures are taken while a minimum spot size for forming a reticle by the CAD is G, a maximum wiring space before expanding a wiring width is M, a maximum wiring space after expanding a wiring width is F, a maximum wiring space in the first (or second) direction after i-times operations in the first (or second) direction is Ti and the operation frequency for expanding a wiring width is n.

(1) A wiring pattern and a dummy wiring pattern are composed.

(2) A reverse pattern corresponding to non-wiring part in the composed wiring pattern is formed, reduced in size by $T_1/2$, moved by $-T_1/2$ in the first (such as X) direction and composed by attaching to the composite wiring pattern of the normal wiring pattern and the dummy wiring pattern.

(3) If necessary, operation (2) is repeated.

Assuming that the operation frequency for expanding a wiring width is n, a reverse pattern of the wiring pattern composed after (i−1)-th operations is formed in (i)-th operation. The reverse pattern is reduced by $T_i/2$, moved by $(-1)^i \times (T_i/2)$ in the first direction and composed with the wiring pattern which has been composed by first to the (i−1)-th operation. The reason the moving amount $T_1/2$ is multiplied by $(-1)^i$ is to attach dummy wiring to normal wiring on both sides, respectively.

(4) The wiring pattern formed in (2) or (3) is reduced by (S−G)/2 and expanded by the same amount, and the notch generated in the first-direction operation is eliminated.

(5) A reverse pattern of the wiring pattern formed in (4) is formed, reduced by $T_1/2$, moved by $-T_1/2$ in the second (such as Y) direction and composed with the wiring pattern formed in (4) by attaching the reverse pattern to the wiring pattern.

(6) If necessary, operation (5) is repeated. Assuming that the operation frequency for expanding a wiring width is n, a reverse pattern of the wiring pattern composed after (i−1)-th operation is formed in (i)-th operation. The reverse pattern is reduced by $T_i/2$, moved by $(-1)^i \times (T_i/2)$ in the second direction and composed with the wiring pattern which has been composed by the (i−1)-th operation.

(7) The wiring pattern formed in (5) or (6) is reduced by (S−G)/2 and expanded by the same amount, and the notch generated in the second-direction operation is eliminated.

The above-described parameters satisfy the following relations.

| | |
|---|---|
| $M - T_1 < S$ | (1) |
| $T_{i-1} - T_i < S$ | (2) |
| $M - T_i < L$ | (3) |
| $T_{i-1} - T_i < L$ | (4) |
| $M > T_1 > \ldots > T_i > \ldots > T_n = F$ | (5) |
| $n \leq (M - F)/G$ | (6) |

In this manner, the wiring space not less than S and less than L+2S can be reduced to F=2S by expanding normal wiring on both sides.

Next, the second-embodiment that is an example according to the present first invention will be described in detail.

In this embodiment, a minimum wiring width L is 1.4 μm and a minimum wiring space S is 1.0 μm. Use of a reticle is needed for patterning. To form a reticle, a minimum spot size G exists. Here, G is 0.1 μm.

FIG. 2 shows a circuit pattern to which dummy wirings are inserted by the conventional technique.

The pattern of FIG. 2 is reduced to not more than 2×S=2.0 μm by conducting two X-direction operations and two Y-direction operations (4 operations in all). In this embodiment, $T_1$ and $T_2$ are set to T1=2.6 μm and T2=2.0 μm to satisfy the expressions (1) and (2). Here, 2.0 μm for T2 is a maximum wiring space F in the final state. F is set to be twice as large as the minimum wiring space S.

Figure 9:
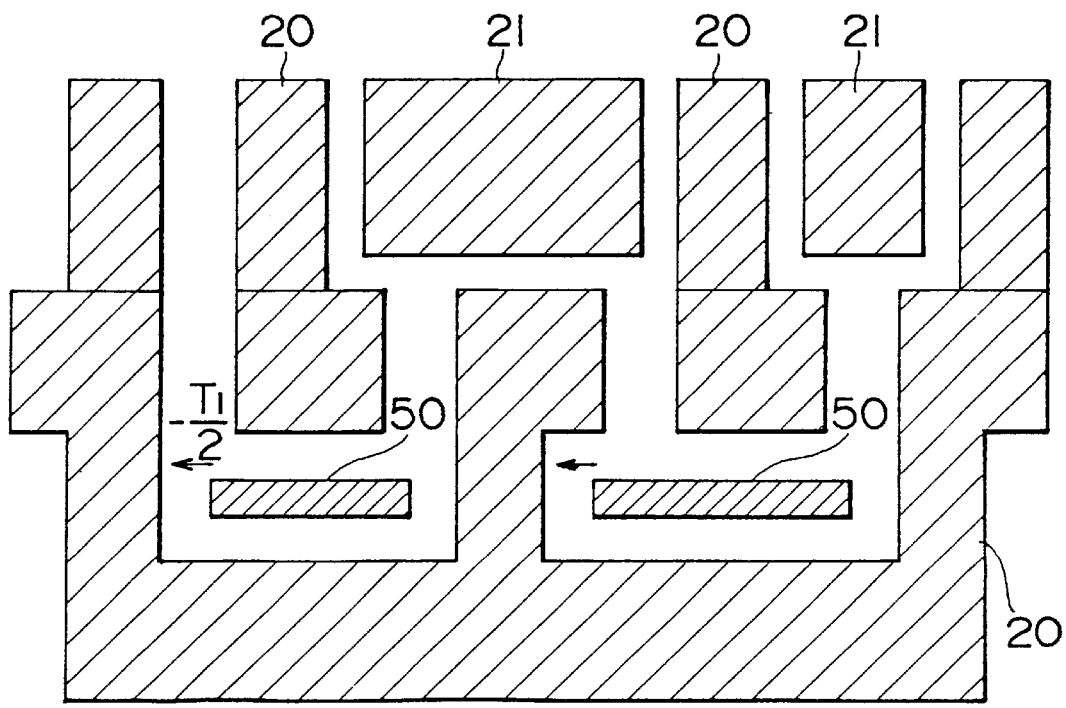
FIG. 9 is a top face view showing that the first imaginary wiring pattern is generated in the X direction for increasing the wiring width in the X direction in the circuit pattern of FIG. 2.

First, the wiring width in the X direction is expanded. As shown in FIG. 9, a first imaginary wiring pattern 50 is generated by reducing the reverse pattern in the wiring region shown in FIG. 8 by $T_1/2=2.6/2=1.3$ μm.

Next, the imaginary wiring pattern 50 is moved by $(-1)1\times(T1/2)=(-1)1\times1.3=-1.3$ μm in the X direction and attached to the left side normal wiring as shown in FIG. 10. The attached imaginary wiring pattern is composed with the normal wiring pattern, thus completing the first operation of expanding the wiring width in the X direction.

The second operation for expanding the wiring width in the X direction is conducted in the same manner. That is, as shown in FIG. 11, a second imaginary wiring pattern 52 is obtained by reducing the non-wiring part wiring pattern by reversing the wiring pattern of FIG. 10, to $T_2/2=2.0/2=1.0$ μm.

Figure 12:
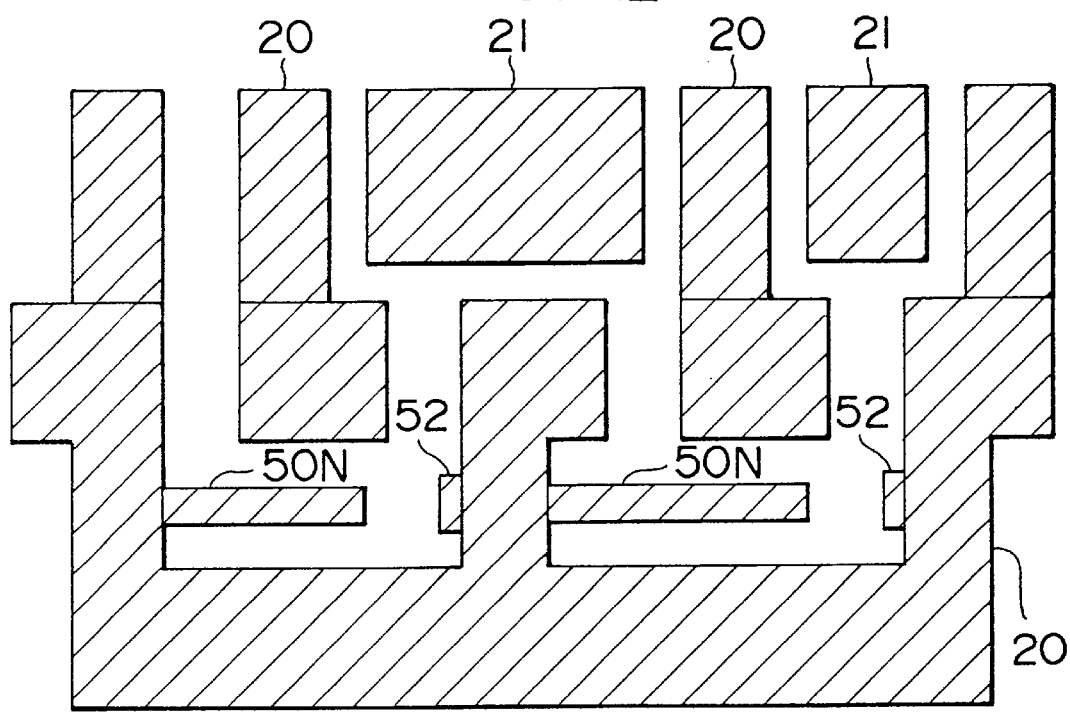
FIG. 12 is a top face view showing that the second imaginary wiring pattern of FIG. 11 has been attached to the right-side circuit pattern.

The second imaginary wiring pattern 52 is moved by $(-1)^2\times T_2/2=-1^2\times 1.0=1.0$ μm in the X direction and attached to the right side normal wiring and composed with the normal wiring, thus forming a wiring pattern shown in FIG. 12.

Next, to eliminate notches 50N which are against the wiring rule, the wiring pattern of FIG. 12 is undersized by $(L-G)/2=(1.4-0.1)/2=0.65$ μm and then oversized. By so doing, notches which are against the wiring rule (the entire first imaginary wiring pattern 50 in this embodiment) are eliminated and a wiring pattern shown in FIG. 13 is obtained.

In this way, the operations of expanding the wiring in the X direction is completed. Next, the operation of expanding the wiring in the Y direction is conducted.

Figure 13:
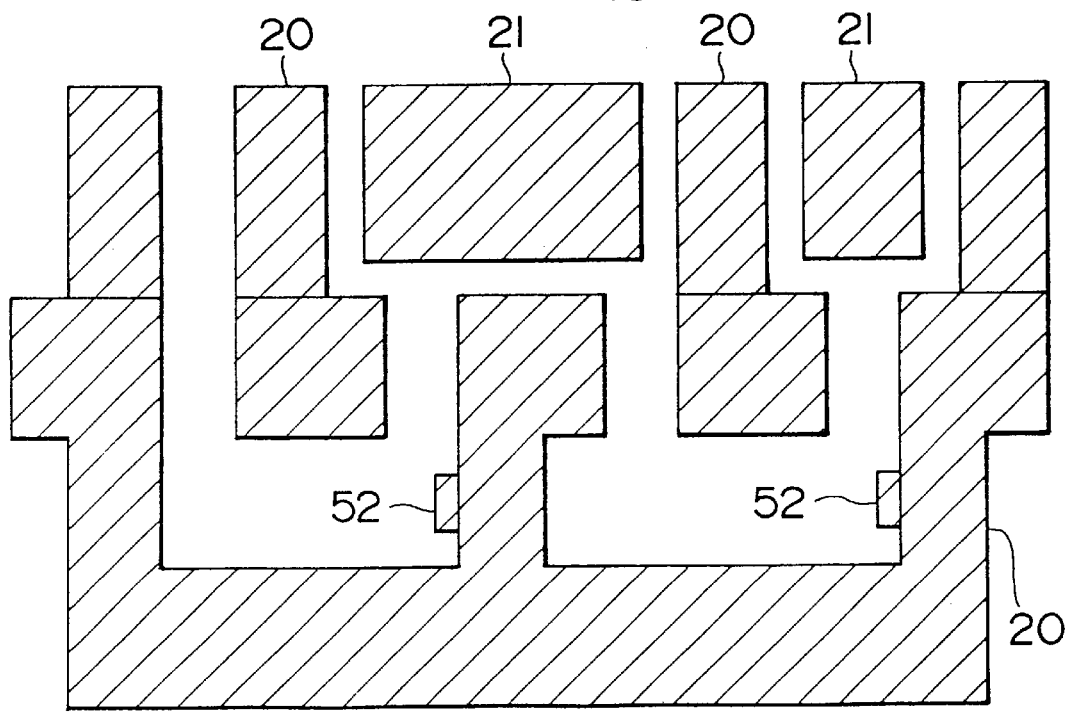
FIG. 13 is a top face view showing that notches of the circuit pattern of FIG. 12 have been eliminated.
Figure 14:
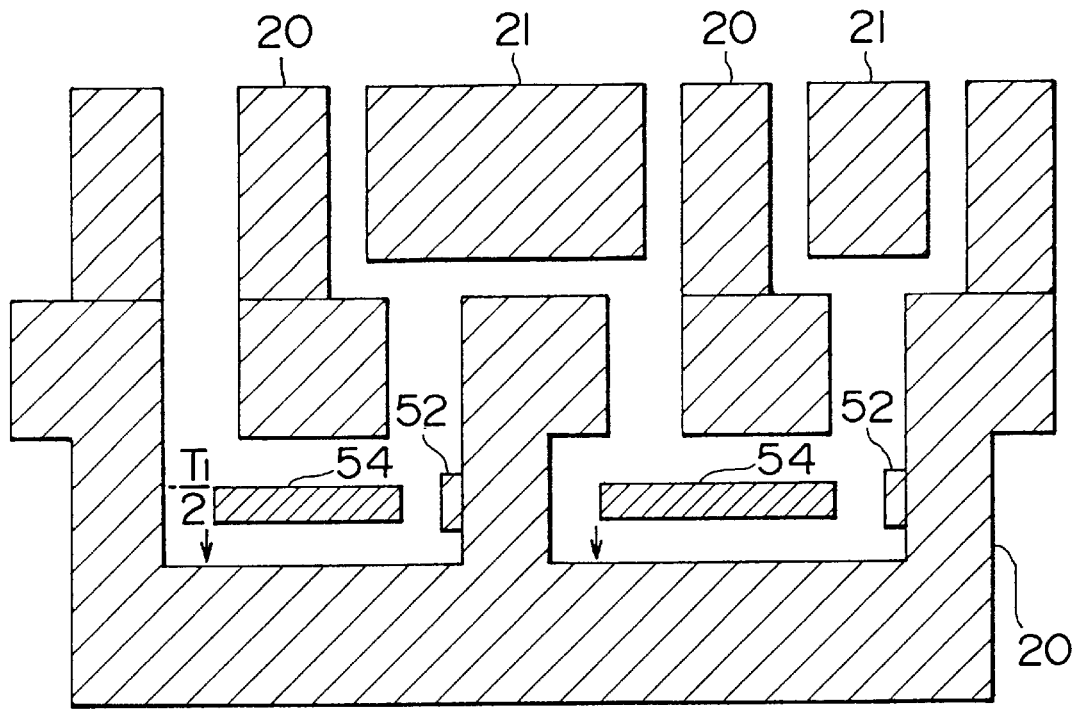
FIG. 14 is a top face view showing that the first imaginary wiring pattern has been generated in the Y direction for increasing the wiring width in the Y direction in the circuit pattern of FIG. 13.
Figure 15:
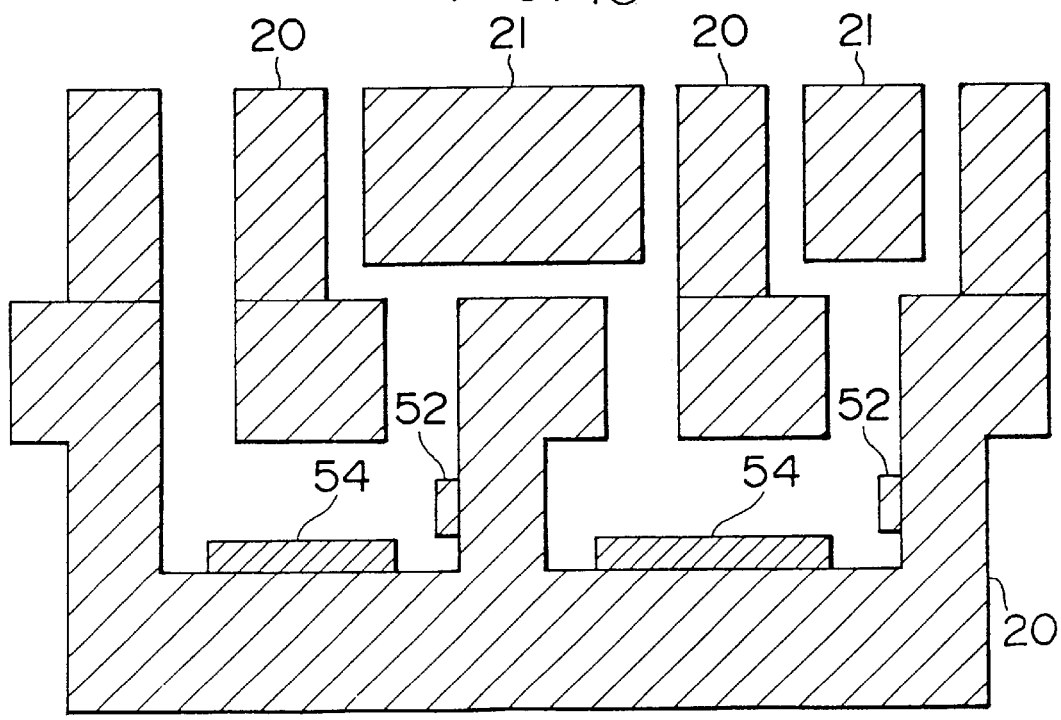
FIG. 15 is a top face view showing that the first imaginary wiring pattern of FIG. 14 has been attached to the lower-side circuit pattern.

Specifically, as shown in FIG. 14. the reverse pattern of the wiring layer of FIG. 13 is undersized by $T_1/2=2.6/2=1.3$ μm to thereby obtain a first imaginary wiring pattern 54 in the Y direction. The wiring pattern 54 is then moved by $(-1)^1\times T_1/2=-1^1\times 1.3=1.3$ μm in the Y direction. Then the pattern 54 is attached to the lower normal wiring shown in the lower part in FIG. 15 and composed with the normal wiring, thereby obtaining a new wiring pattern shown in FIG. 16. Thus, the first operation of expanding the wiring width in the Y direction is completed.

Figure 16:
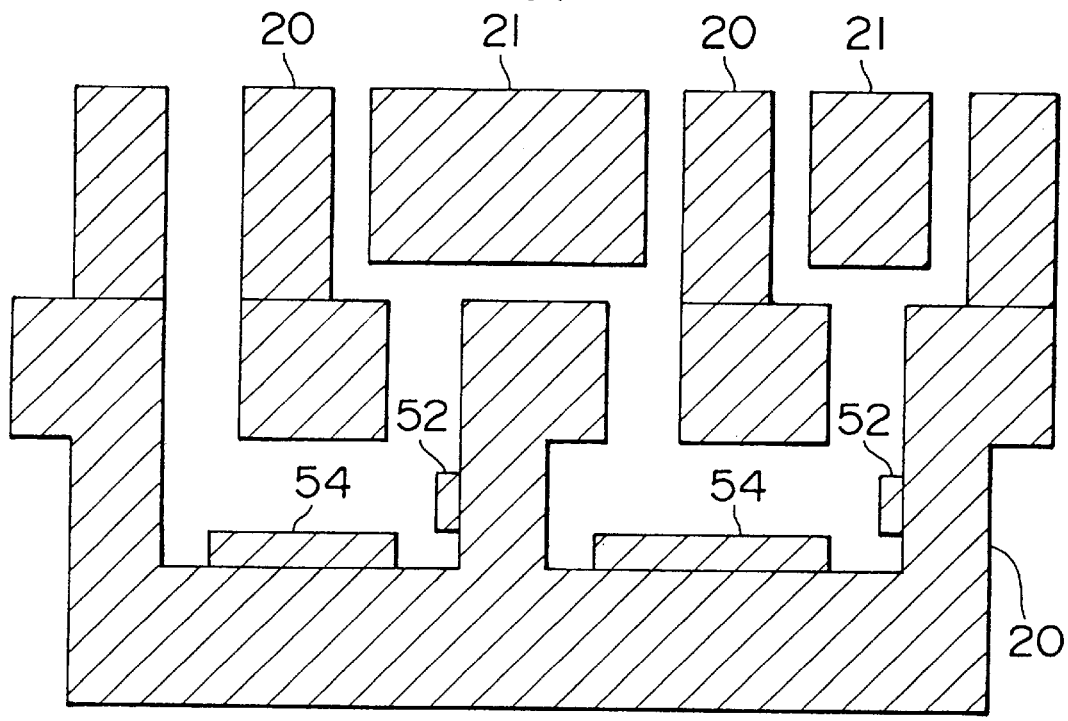
FIG. 16 is a top face view showing that the circuit pattern of FIG. 15 and the first imaginary wiring pattern has been composed.
Figure 17:
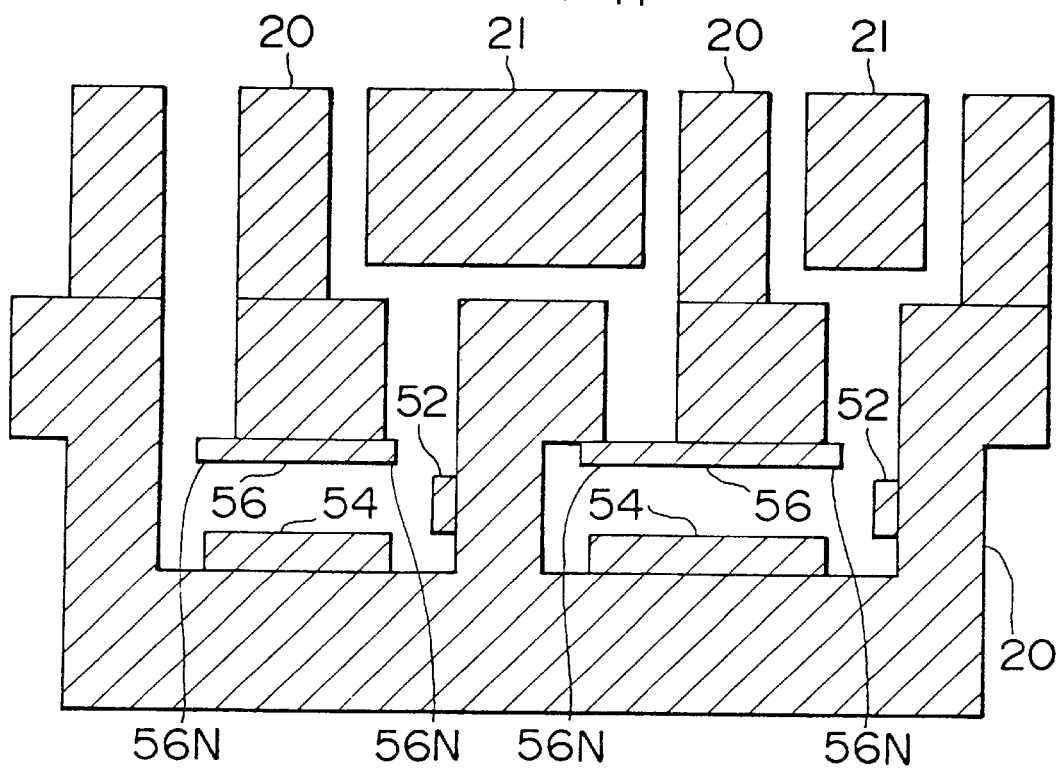
FIG. 17 is a top face view showing that the second imaginary wiring pattern has been generated in the Y direction in the circuit pattern of FIG. 16 and has been attached to the upper-side circuit pattern.

Next, the second operation of expanding the wiring width in the Y direction is conducted in the same manner. That is, the reverse pattern of the wiring layer shown in FIG. 16 is undersized by $T_2/2=2.0/2=1.0$ μm to thereby generate a second imaginary wiring pattern 56 in the Y direction. Then, the pattern 56 is moved by $(-1)^2\times T_2/2=(-1)^2\times 1.6=1.6$ μm and attached to and composed with the upper normal wiring shown in the upper part of FIG. 16 and composed with the normal wiring, thereby obtaining a new wiring pattern shown in FIG. 17.

Figure 18:
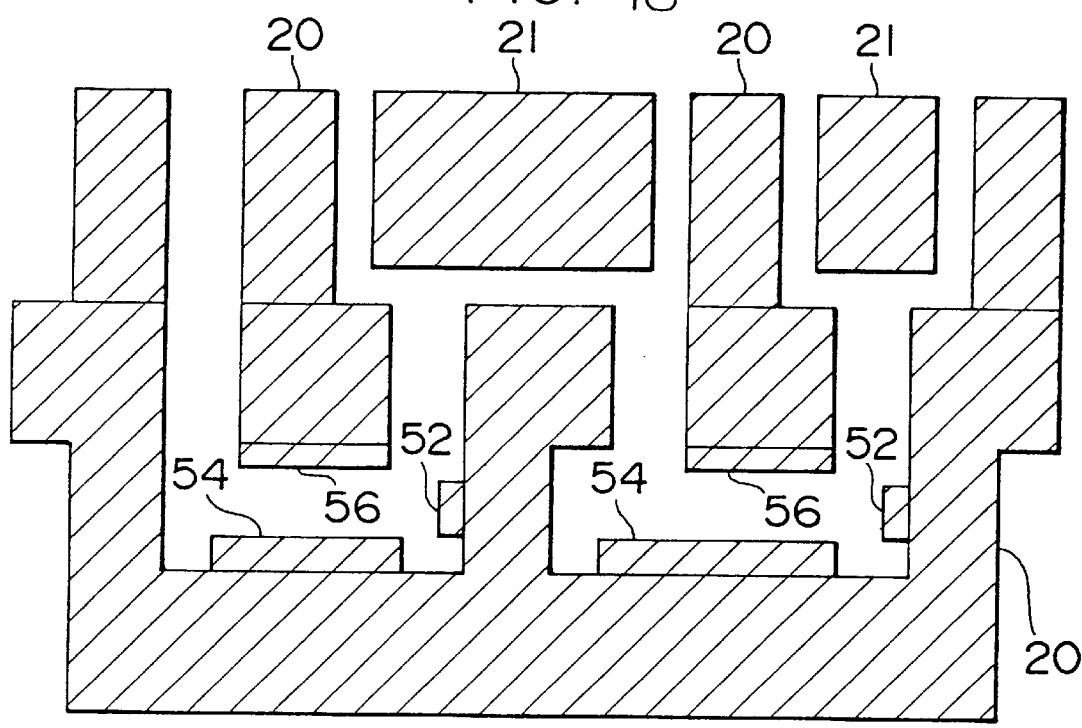
FIG. 18 is a top face view showing the final circuit pattern obtained by eliminating notches of the circuit pattern of FIG. 17.

Thereafter, to eliminate notches 56N of the imaginary wiring pattern, the wiring pattern is undersized by $(L-G)/2=(1.4-0.1)/2=0.65$ μm and then oversized. By conducting this operation, the pattern which is against the wiring rule is eliminated. In the final pattern, F is 2S as shown in FIG. 18.

Using a reticle for wiring designed and formed in the above-described operations, a wiring layer is formed. Specifically, a first insulating film is formed on the MOS transistor which has been formed in the semiconductor substrate in advance. A contact hole is formed in the first insulating film. A wiring layer made of, for example, aluminum is deposited and patterned based on the pattern shown in FIG. 18. Next, an interlayer insulating film for isolating the first wiring layer and the second wiring layer is formed by using, for example, a coating insulating film and a predetermined via hole is formed. Upper wiring layers are formed in the same manner as in the case of the formation of the first layer. Thus, the formation of a semiconductor chip is completed.

In this embodiment, the width of the imaginary wiring pattern is made to be about one half of a necessary width to obtain a target wiring space, and the width is added to the wiring patterns at both sides facing the wiring space, respectively by conducting two operations. It is thus made possible to expand the both-side wirings facing the wiring pattern by conducting operations a minimum number of times. However, the frequency n of the operation of expanding the wiring should not be limited to 2. It is possible that the predetermined width of an imaginary wiring pattern is set to be not more than a maximum wiring width and the pattern is added to both wiring patterns facing the wiring space repeatedly while reducing the predetermined width step by step until a target wiring space is obtained. In this case, the frequency n of wire expanding operation is increased and the imaginary pattern is added to the normal wiring little by little to thereby allow the expanding amount to be added to the normal wirings on the both sides to have a substantially same width. The capacity of wirings can be also increased in a uniform manner. In this case, the operation of eliminating notches can be conducted in each operation as in the case of the embodiment or only once in the final stage.

Although the above description has been made with reference to the MOS transistor, the present first invention should not be limited thereto. Obviously, the present first invention can be applied to other semiconductor devices having a multiple wiring layer structure such as a bipolar transistor.

The third embodiment according to the present second invention will be described in detail hereinafter.

Figure 19:
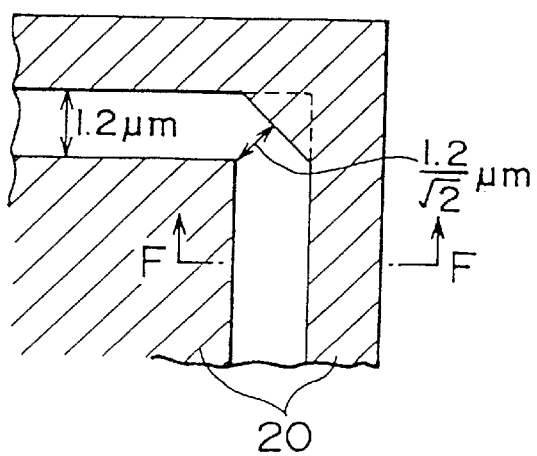
FIG. 19 is a plan view showing an example of a wiring pattern in the third embodiment according to the present second invention.

In this embodiment, an 45° isosceles triangle is provided in the inner corner of the bent wiring 20 as shown in FIG. 19. By so doing, compared to FIG. 33, the wiring space at the bent portion can be equal to or smaller than that at the straight portion.

Figure 20:
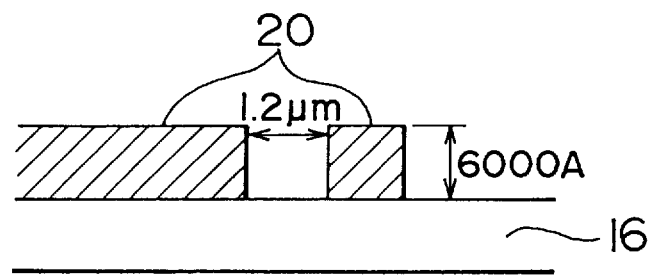
FIG. 20 is a cross-sectional view taken along lines F—F of FIG. 19.
Figure 21:
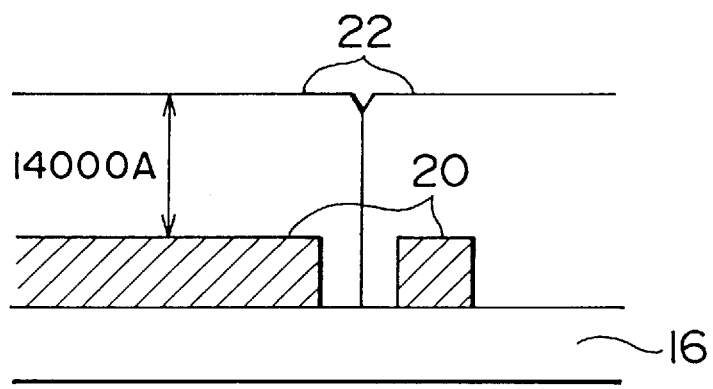
FIG. 21 is a cross-sectional view showing that the insulating film has been just formed on the metal wiring of FIG. 20.
Figure 22:
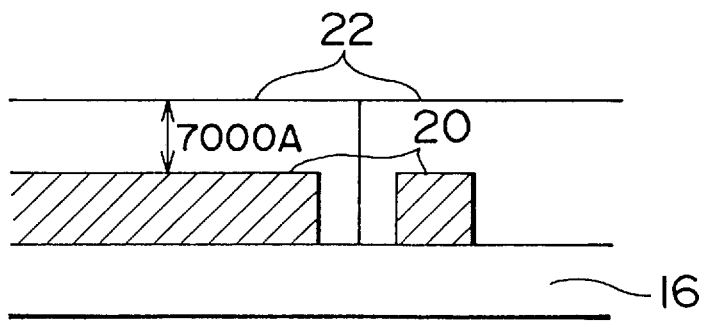
FIG. 22 is a cross-sectional view showing the state after the insulating film of FIG. 21 has been polished to a predetermined thickness.
Figure 34:
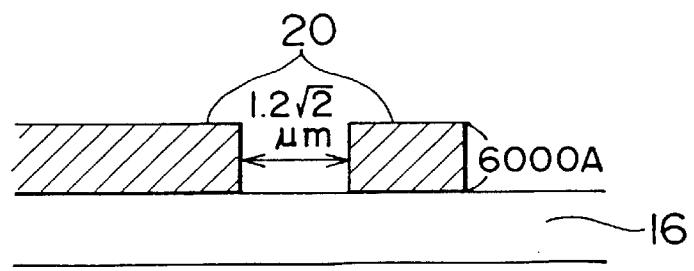
FIG. 34 is a cross-sectional view taken along lines E—E of FIG. 33.
Figure 35:
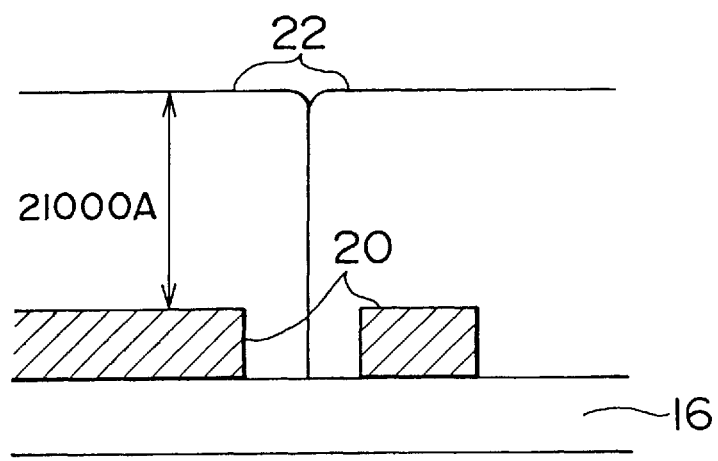
FIG. 35 is a cross-sectional view showing the state right after the insulating film has been formed on the metal wiring of FIG. 34.
Figure 36:
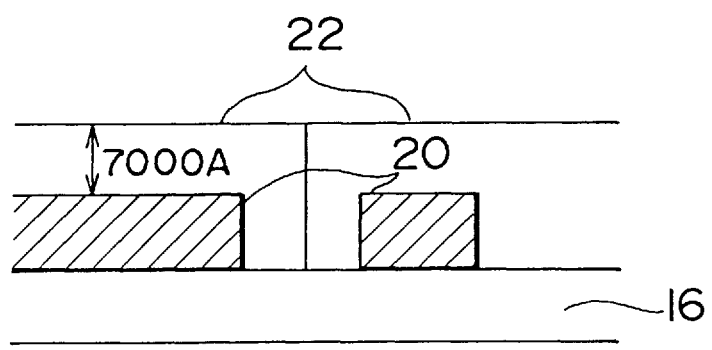
FIG. 36 is a cross-sectional view showing the state right after the insulating film of FIG. 35 has been polished to a predetermined thickness.

The film formation steps are illustrated by FIGS. 20 to 22 in contrast to prior art FIGS. 34 to 36. As in the case of the prior art, the formation of a flat insulating film having a wiring step of 6000 Å and having a minimum thickness of 7000 Å to the upper wiring layer in the wiring pattern shown in FIG. 19 is described.

An interlayer insulating film 16 is formed on a silicon substrate (not shown) and a metal wiring 20 having a thickness of 6000 Å is formed on the interlayer insulating film 16 by using the pattern of FIG. 19 and by the usual method in advance. FIG. 20 shows the cross-sectional view taken along lines F—F of FIG. 19 which is the widest wiring space in the pattern of FIG. 19. In this state, using a P-TEOS CVD device, an insulating film 22 for isolating the upper wiring is formed. In the P-TEOS CVD device, the film formation ratio of the upper part of the wiring to the sidewall is 5:2. To bury the wiring space of 1.2 $\mu$m shown in FIG. 20, a film thickness of approximately 14000 Å is necessary as shown in FIG. 21. A maximum thickness of 9000 Å is obtained by the P-TEOS CVD device per once operation. A film with a thickness of 7000 Å is formed twice. State after the twice formation is shown in FIG. 21. Thereafter, the film is polished to a thickness of 7000 Å by the CMP method, thereby obtaining a desired flat insulating film shown in FIG. 22.

As can be seen from the above description, if using the wiring pattern of FIG. 20, a flat insulating film 22 shown in FIG. 22 can be formed by depositing an insulating film to a thickness of 7000 Å twice (14000 Å in total) and by polishing the film to a thickness of 7000 Å by the CMP method.

If the CMP method is used for polishing, it is well known that if a polished amount is large, the surface uniformity after polishing is lowered. However, in this embodiment, the polishing amount can be reduced from 14000 Å to 7000 Å. As a result, not only through put but also surface uniformity are improved. It is noted that the polishing method should not be limited to the CMP method.

In this embodiment, since an isosceles triangle is added to the corner of the outer bent wiring, the wiring space at the bent portion is $1/\sqrt{2}$ of that at the straight portion. Nevertheless, the wiring pattern is easily designed.

Figure 33:
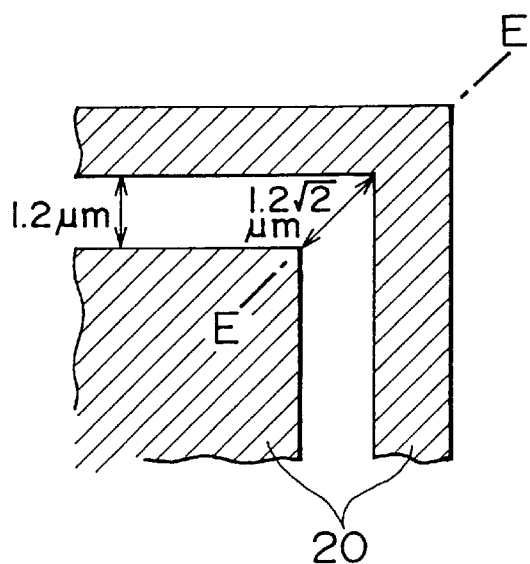
FIG. 33 is a plan view showing a simple bent pattern according to the prior art.

It is also noted that the method of making the wiring space at the bent portion narrower than that of the simple bent wiring pattern as shown in FIG. 33 should not be limited to the above-described one.

Figure 23:
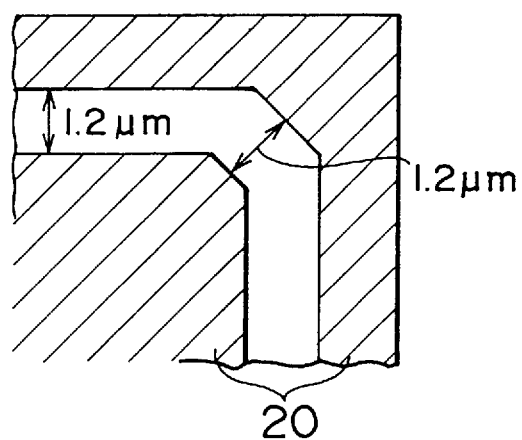
FIG. 23 is a plan view showing an example of the wiring pattern in the fourth embodiment according to the present second invention.
Figure 24:
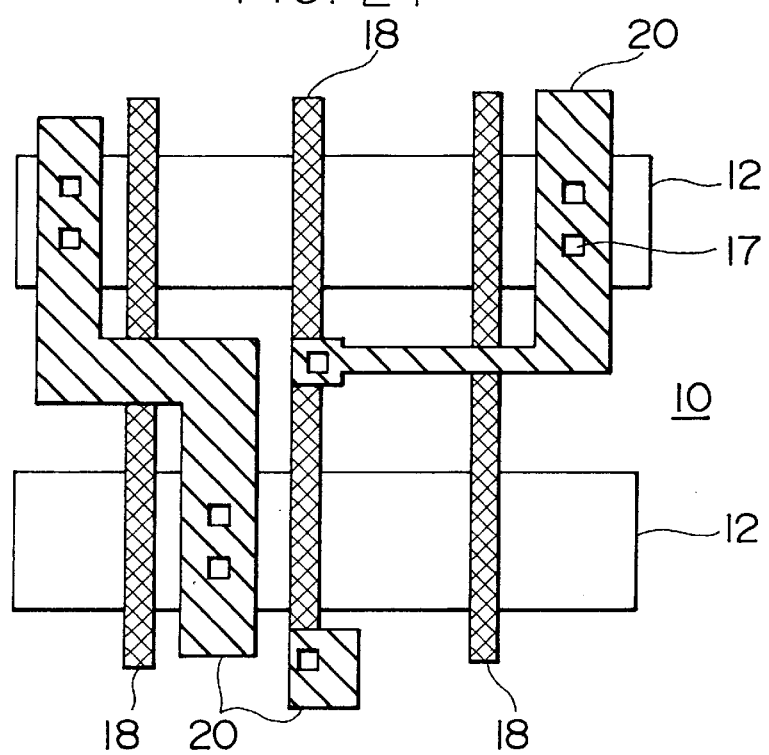
FIG. 24 is a top face view showing an example of multiple wiring layers in the conventional MOS transistor.
Figure 25:
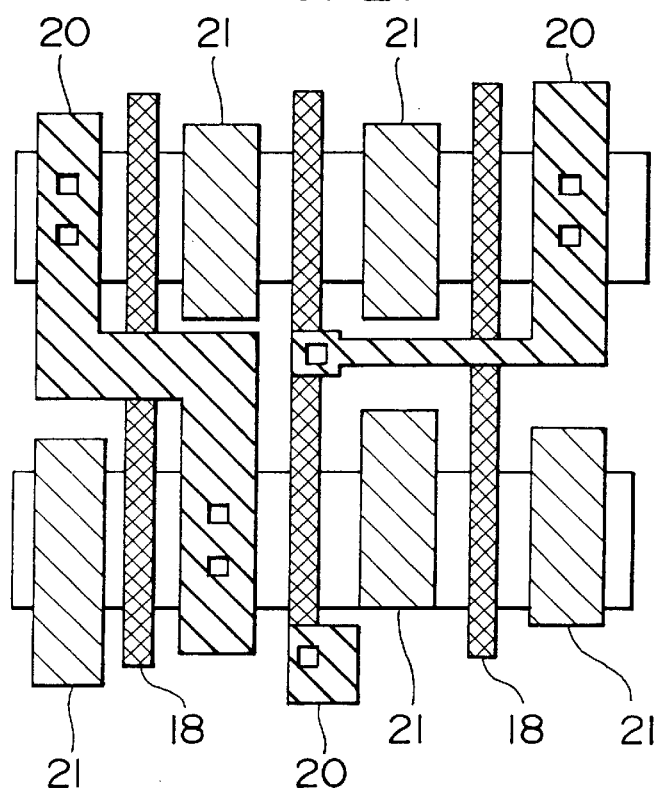
FIG. 25 is a top face view showing that dummy wiring have been added to the wiring pattern of FIG. 24.
Figure 26:
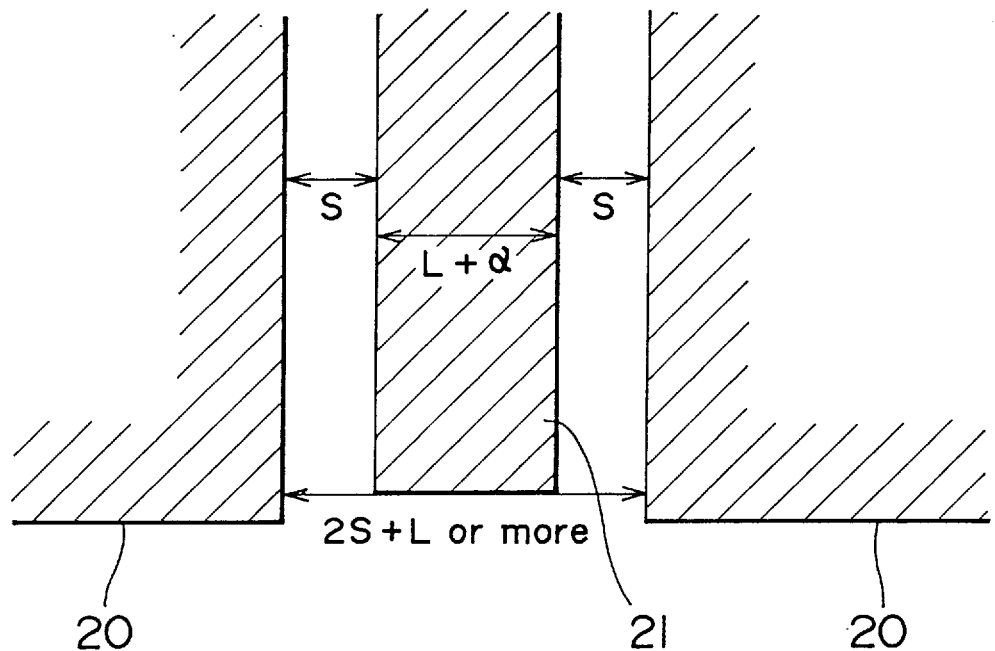
FIG. 26 is a top face view showing that the dummy wiring has been inserted while sufficient wiring space is kept according to the conventional device.
Figure 27:
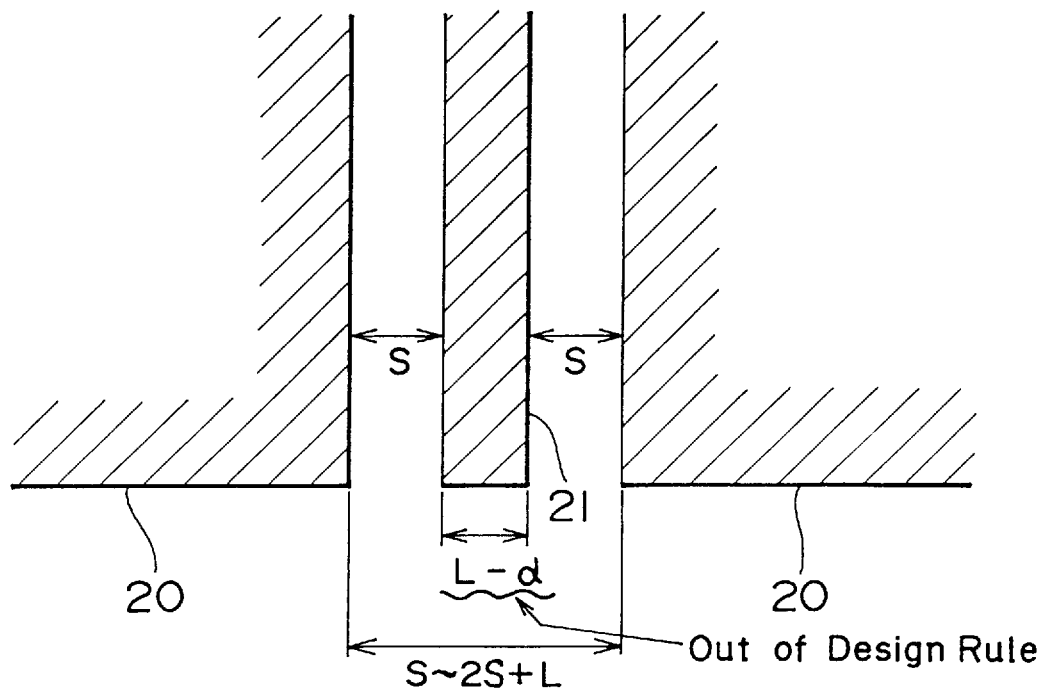
FIG. 27 is a top face view showing that the dummy wiring has been inserted while wiring space is insufficient according to the conventional device.
Figure 28:
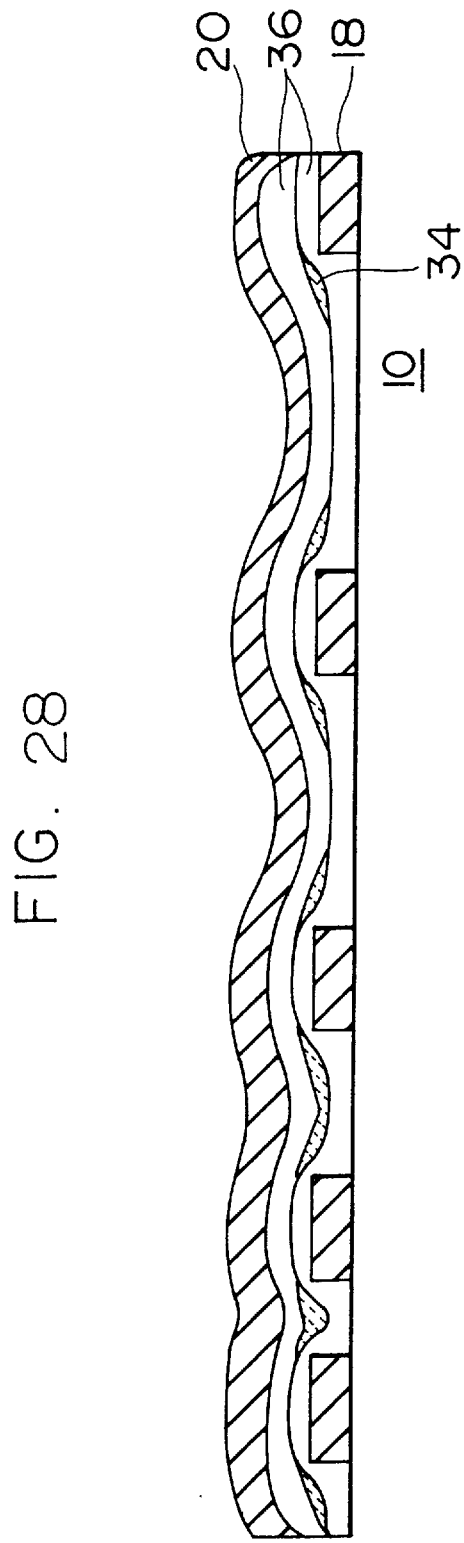
FIG. 28 is a cross-sectional view of the semiconductor chip for describing problems of prior art.
Figure 29:
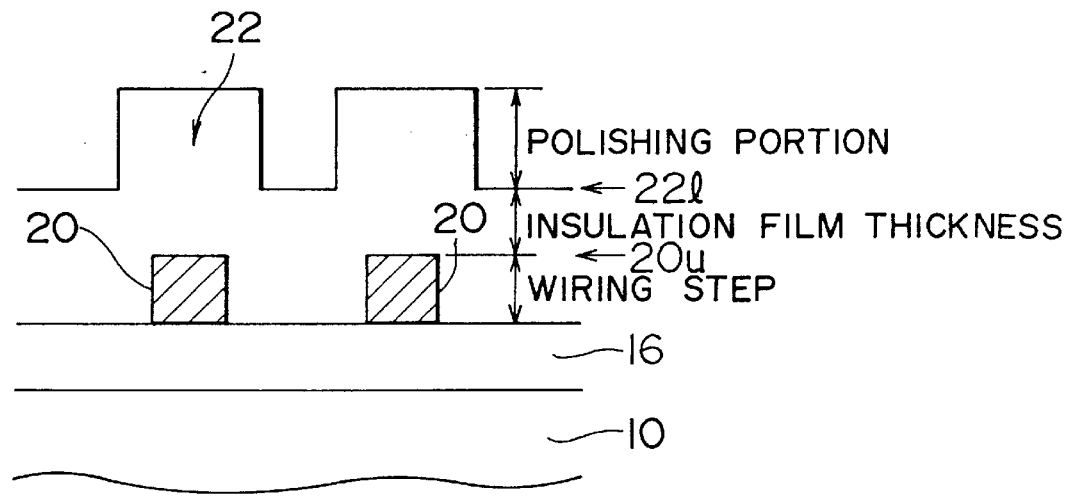
FIG. 29 is a cross-sectional view showing the state right after the insulating film has been formed on the metal wiring according to the prior art.
Figure 30:
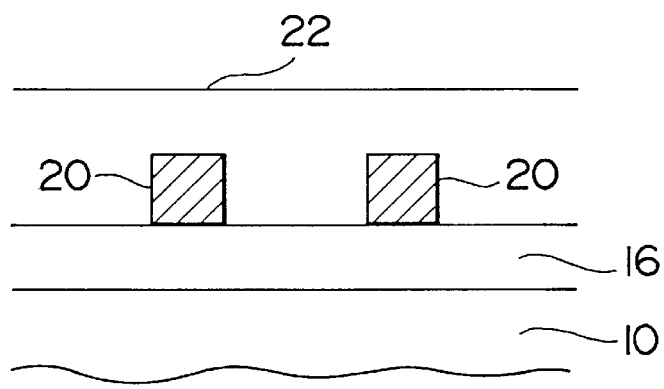
FIG. 30 is a cross-sectional view showing the state after the insulating film of FIG. 29 has been polished.
Figure 31:
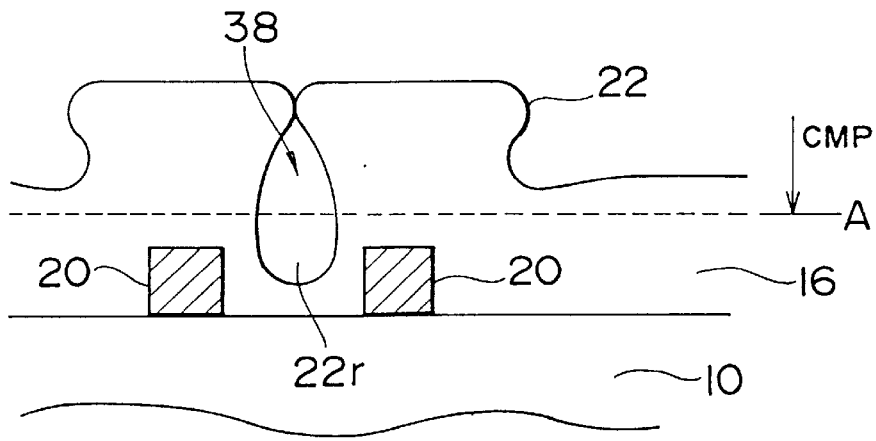
FIG. 31 is a cross-sectional view showing that an insulating film has been formed on the wiring layer by using a film formation method with bad coverage according to the prior art.
Figure 32:
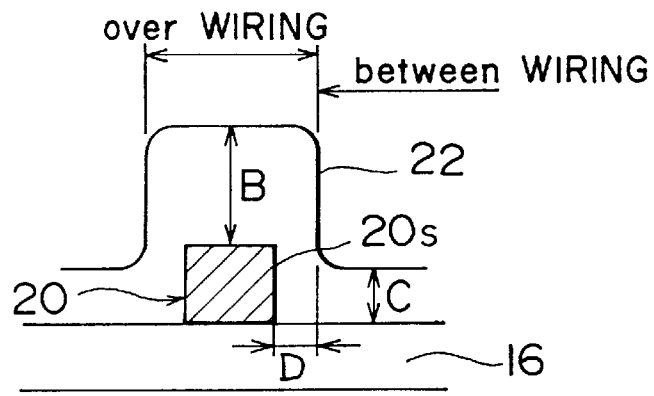
FIG. 32 is a diagram for describing the film formation ratio of the prior art.

It is possible to adopt the method described in the fourth embodiment in FIG. 23. That is, an isosceles triangle is added to the corner of the outer bent wiring and the corner of the inner wiring is cut.

In this embodiment, the wiring space at the bent portion can be almost the same as that at the straight portion.

It should be apparent to those skilled in the art that the above-described embodiments are merely illustrative which represent the application of the principles of the present invention. Numerous and varied other arrangements can be readily devised by those skilled in the art without departing from the spirit and the scope of the invention.

What is claimed is:

1. A method for manufacturing semiconductor device, comprising the steps of:

depositing a metal film for forming wirings on a substrate;

forming a wiring layer using a wiring pattern, wherein dummy wiring is inserted between wiring space where the dummy wiring can be inserted, and wiring space, where the dummy wiring cannot be inserted, is reduced by widening wiring pattern facing the wiring space wherein the width of the wiring pattern where the dummy wiring cannot be inserted is wider than the width of the wiring pattern where the dummy wiring can be inserted;

forming an interlayer insulating film on said wiring layer; and flattening surface of the interlayer insulating film.

2. A method according to claim 1, wherein both wiring patterns facing the wiring space is widened by almost same value.

3. A method according to claim 1, wherein the wiring space, wherein the dummy wiring cannot be inserted, is reduced to minimum wiring space.

4. A method according to claim 1, wherein the wiring space, wherein the dummy wiring cannot be inserted, is reduced to twice as large as minimum wiring space.

5. A method according to claim 1, wherein the step of flattening said surface of the interlayer insulating film is conducted by a Chemical Mechanical Polishing method.

6. A method according to claim 1, wherein the step of flattening said surface of the interlayer insulating film is conducted by an etchback of entire surface of the interlayer insulation film.

7. A method according to claim 1, wherein a wiring space at a bent portion is made smaller than a wiring space at a simply bent portion in said step of forming the wiring layer.

8. A method according to claim 7, wherein the wiring space at said bent wiring portion is narrowed by adding an isosceles triangle-shaped portion to a corner of an outer wiring.

9. A method for manufacturing semiconductor device having multiple wirings, comprising the steps of:

generating an imaginary wiring pattern having a predetermined width in a portion having too narrow a space between wirings to insert a dummy wiring thereinto;

attaching the generated imaginary wiring pattern to at least one of wiring patterns facing the wiring space; and eliminating a portion having a width narrower than a minimum wiring width from the wiring pattern after attaching the imaginary wiring pattern, thereby widening said wiring pattern facing the wiring space.

10. A method according to claim 9, wherein said predetermined width is set at a predetermined value not more than a maximum wiring width, and while the predetermined value being reduced, the predetermined value is added to both of wiring patterns facing the wiring space by repeating the addition operation until a target wiring space is obtained.

11. A method according to claim 9, wherein said predetermined width is set at approximately half a width necessary to expand a wiring for obtaining a target wiring space, and said predetermined width is added to both of wiring patterns facing the wiring space by twice operation.

12. A method for manufacturing reticle for wiring semiconductor device having multiple wirings, comprising the steps of:

generating an imaginary wiring pattern having a predetermined width in a portion having too narrow a space between wirings to insert a dummy wiring thereinto;

attaching the generated imaginary wiring pattern to at least one of wiring patterns facing the wiring space; and eliminating a portion having a width narrower than a minimum wiring width from the wiring pattern after attaching the imaginary wiring pattern, thereby widening said wiring pattern facing the wiring space.

13. A method according to claim 12, wherein processing of claim 12 is conducted in two directions perpendicular to each other.

14. A method according to claim 12, wherein said predetermined width is set at a predetermined value not more than a maximum wiring width, and while the predetermined value being reduced, the predetermined value is added to both of wiring patterns facing the wiring space by repeating the addition operation until a target wiring space is obtained.

15. A method according to claim 14, wherein processing of claim 14 is conducted in two directions perpendicular to each other.

16. A method according to claim 12, wherein
said predetermined width is set at approximately half a width necessary to expand a wiring for obtaining a target wiring space, and
said predetermined width is added to both of wiring patterns facing the wiring space by twice operation.

17. A method according to claims 16, wherein processing of claim 16 is conducted in two directions perpendicular to each other.

* * * * *